US006936907B2

(12) United States Patent
Chen

(10) Patent No.: US 6,936,907 B2
(45) Date of Patent: Aug. 30, 2005

(54) LATERAL HIGH-VOLTAGE SEMICONDUCTOR DEVICES WITH SURFACE COVERED BY THIN FILM OF DIELECTRIC MATERIAL WITH HIGH PERMITTIVITY

(75) Inventor: Xingbi Chen, Chengdu (CN)

(73) Assignee: The University of Electronic Science and Technology of China, Sichuan (CN)

( * ) Notice: Subject to any disclaimer, the term of this patent is extended or adjusted under 35 U.S.C. 154(b) by 0 days.

(21) Appl. No.: 10/652,414

(22) Filed: Aug. 29, 2003

(65) Prior Publication Data

US 2004/0041237 A1 Mar. 4, 2004

(30) Foreign Application Priority Data

Aug. 29, 2002 (CN) ........................................ 02142183 A

(51) Int. Cl.[7] ........................ H01L 23/58; H01L 29/861; H01L 31/107

(52) U.S. Cl. ........................ 257/492; 257/605; 257/606

(58) Field of Search ................................ 257/492, 605, 257/606

(56) References Cited

U.S. PATENT DOCUMENTS

| 4,712,877 | A | * | 12/1987 | Okada et al. ................. 349/85 |
| 5,332,962 | A | * | 7/1994 | Sameshima ............. 324/103 P |
| 5,726,469 | A |  | 3/1998 | Chen ........................... 257/111 |
| 6,235,577 | B1 | * | 5/2001 | Jeon ............................. 438/253 |
| 6,310,365 | B1 |  | 10/2001 | Chen ........................... 257/285 |
| 2003/0006437 | A1 | * | 1/2003 | Mizuta et al. ............. 257/283 |

OTHER PUBLICATIONS

X.B. Chen et al., "Optimization of the Drift Region of Power MOSFET's with Lateral Structures and Deep Junctions", IEEE Transactions on Electron Devices, vol. ED–34. No. 11, Nov., 1957.

X.B. Chen et al., "Theory of Optimum Design of Reverse–Biased p–n Junctions Using Resistive Field Plates and Variation Lateral Doping", Solid–State Electronics, vol. 35, No. 9, pp. 1365–1370, 1992.

X.B. Chen et al., "Lateral high–voltage devices using an optimized variational lateral doping", Int. J. Electronics, vol. 80, No. 3, pp. 449–459, 1996.

* cited by examiner

*Primary Examiner*—William M. Brewster
(74) *Attorney, Agent, or Firm*—Fish & Neave IP Group of Ropes & Gray LLP

(57) ABSTRACT

This invention provides a method or an auxiliary method to implement optimum variation lateral flux on a semiconductor surface. The method is to cover one or more thin films of high permittivity dielectric material on the semiconductor surface. The one or more films are capable of transmitting flux into or extracting flux from the semiconductor surface, or even to extract some flux from a part of the semiconductor surface and then transmit the flux to another part of the semiconductor surface. By using optimum variation lateral flux, not only can high-voltage lateral devices be made, but also an edge-termination technique for high-voltage vertical devices is provided. While the thin films can be used to prevent the occurrence of strong electric fields produced at the edges of some doped regions, these regions are used to compensate other doped regions with opposite doping and different location. Thin films can also be used to realize an optimum variation lateral flux of a lateral semiconductor device, which is located on a substrate and the flux flowing between the semiconductor and the substrate is negligibly small.

20 Claims, 9 Drawing Sheets

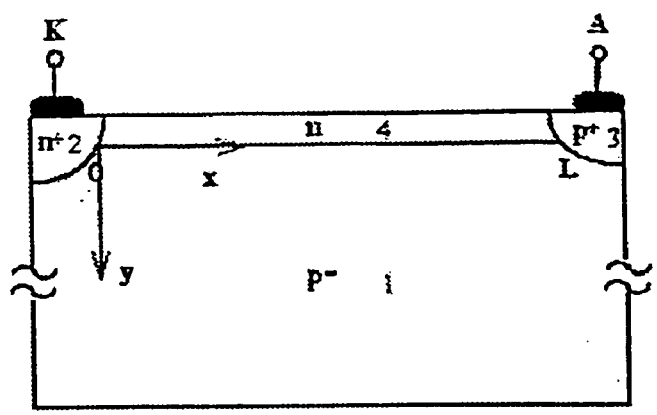
Fig.1 (a) (Prior Art)
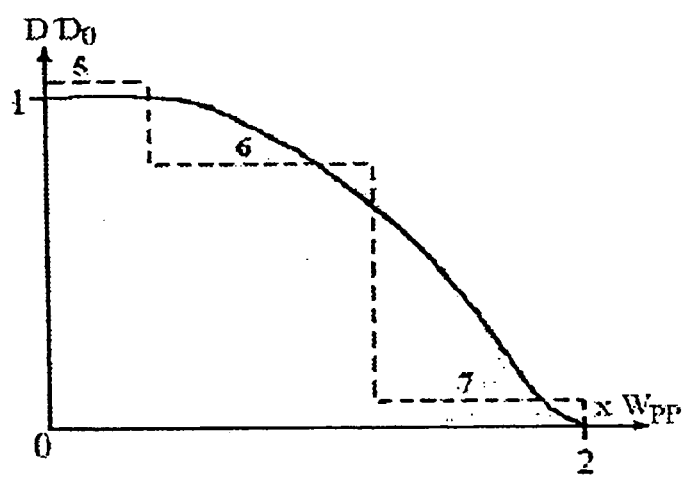
Fig.1 (b) (Prior Art)
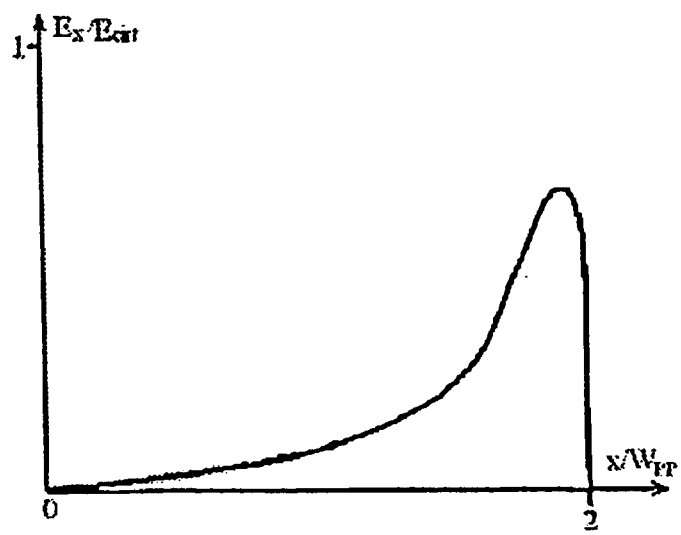
Fig.1 (c) (Prior Art)

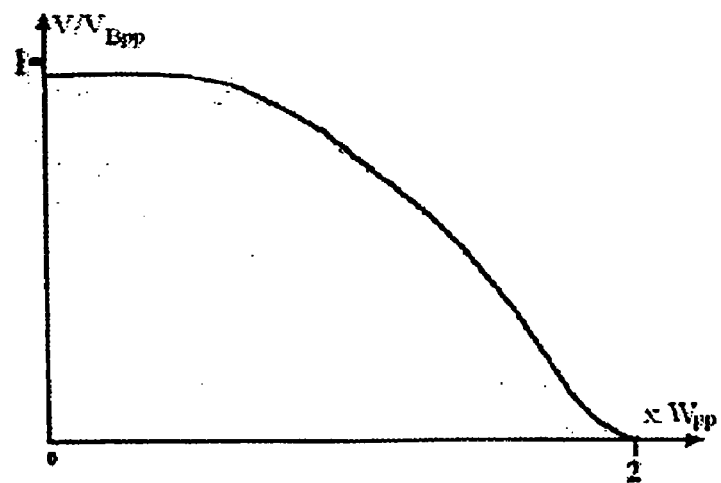
Fig.1 (d) (Prior Art)
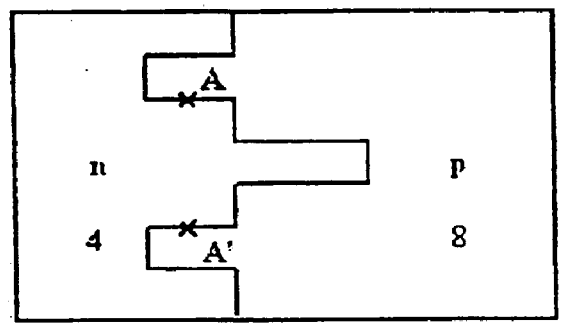
Fig.1 (e) (Prior Art)
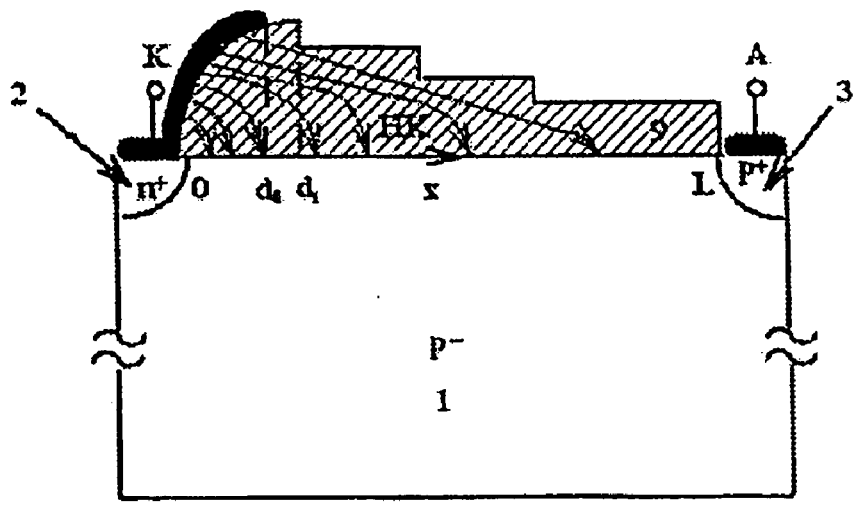
Fig.2

LATERAL HIGH-VOLTAGE SEMICONDUCTOR DEVICES WITH SURFACE COVERED BY THIN FILM OF DIELECTRIC MATERIAL WITH HIGH PERMITTIVITY

CROSS REFERENCE TO RELATED APPLICATION

Under 35 U.S.C. § 119, this application claims the benefit of copending Chinese Patent Application for Invention No. CN 02142183.8, filed Aug. 29, 2002, which is hereby incorporated by reference herein in its entirety.

TECHNICAL FIELD

The present invention relates to semiconductor high-voltage devices and power devices, more particularly to a surface voltage-sustaining region of lateral devices and edge termination of vertical devices.

BACKGROUND OF THE INVENTION

In order to improve the breakdown voltage and reduce the on-resistance of a lateral metal-oxide-semiconductor transistor (MOST), the conventional reduced surface field (RESURF) technique is typically used. However, it can be inferred from X. B. Chen, et al., "Optimization of the drift region of power MOSFET's with lateral structure and deep junctions," IEEE Trans. E. D. vol. ED-34, No. 11, pp. 2344–2350 (1987), that the breakdown voltage of a surface device using the RESURF technique can only achieve about 70% of that of a one-sided abrupt parallel-plane junction with the same substrate. Moreover, the specific on-resistance of a lateral MOST using such a technique is large. In commonly-assigned U.S. Pat. Nos. 5,726,469 and 6,310,365 B1, methods for using optimum variation surface doping to implement the surface voltage-sustaining region are disclosed. By using these methods, the breakdown voltage of a surface device can reach 90% of that of a one-sided abrupt parallel-plane junction with the same substrate. Furthermore, lateral MOSTs with a small specific on-resistance of the drift region can be made. Such a surface voltage-sustaining region can be realized by the offset of the effects of the impurities of different located p-regions and n-regions. Therefore, the fabrication can be compatible with conventional CMOS or BiCMOS technology.

In X. B. Chen, et al., "Theory of optimum design of reverse-biased p-n junction using resistive field plates and variation lateral doping," Solid-State Electronics, Vol. 35, No. 8, pp. 1365–1370 (1992), it has been shown that the optimum surface doping density, e.g., donor density, for a surface voltage-sustaining region on an oppositely doped substrate, e.g., a p⁻-substrate, has been disclosed. FIG. 1(a) shows the structure of the voltage-sustaining region of an interdigitated layout cell of a diode having a p⁻-type substrate 1, an $n^{30}$-type contact region 2, a p⁺-type contact region 3, n-region 4 in the surface voltage-sustaining region, an anode A, and a cathode K.

The surface voltage-sustaining region is located from the abscissa x=0 to x=L. The solid curve in FIG. 1(b) represents the optimum charge density D of the surface impurities for a maximum breakdown voltage under a given surface distance. In this figure, $D_0 = qN_B W_{pp}$, where q is the electron charge, $W_{pp}$ is the depletion width under the same breakdown voltage of a one-sided abrupt parallel-plane junction (n⁺-p⁻) with the same substrate doping concentration, and $N_B$ is the acceptor concentration of the substrate. Thus, $D_0$ is the charge density of the depletion layer in n⁺-region. The solid curve in this figure shows a case of $L=2W_{pp}$, which corresponds to the case of a breakdown voltage of the surface voltage-sustaining region being 95% of that of the one-sided abrupt parallel-plane junction with the same substrate. Dashed lines 5, 6 and 7 represent three uniform surface charges to replace the solid curve and can be used to achieve a breakdown voltage very close to that of the latter. FIG. 1(c) and FIG. 1(d) represent the lateral field profile $E_x$ and surface potential V given by the optimum variation lateral doping under the breakdown voltage, where $E_{crit}$ and $V_{Bpp}$ stand for the maximum field and the breakdown voltage of the one-sided abrupt parallel-plane junction with the same substrate. FIG. 1(e) shows schematically a top view of a structure to implement three sections of uniform surface impurity charge densities. There is a uniform density of donor density in n-region 4, this charge density is higher than that of the dashed line 5. There is a thin p-type region 8, with uniform acceptor density covered partly on the top of the n-region 4. From the left part to the right part, the proportion of covered n-region changes from zero to 100%. In the part containing points A and A' in the figure, the resultant effect of the charge of the donor density of region 4 and the charge of the acceptor density of region 8 approximately equals to the average charge density of dashed line 5 in FIG. 1(b). In the right part of the part containing the points A and A', the resultant effective charge density equals to the dash line 6. In the rightmost part of the figure, the resultant effective charge density is equivalent to dashed line 7.

It should be noted that the more number of sections used, the closer the breakdown voltage is to the value corresponding to the result of the solid curve of FIG. 1(b).

However, it can be encountered sometimes that the dose of p-region 8 and/or the dose of n-region 4 is not available in a specific CMOS or BiCMOS technology. Besides, in the case of sub-micron technology, the n-type drift region 4 is very thin, accompanying a high donor concentration and thus a low mobility. Therefore, a lateral n-MOST using such technique may have very large specific on-resistance. Moreover, as pointed in X. B. Chen, "Lateral high-voltage devices using an optimized variation lateral doping," Int. J. Electronics. Vol. 83, No. 3, pp. 449–459 (1996), in the method of the offset of the effects of two regions with the opposite charges, there is a field parallel to the semiconductor surface and orthogonal to the edge of the stripe at point A and point A' in FIG. 1(e), this field causes a decrease of the breakdown voltage.

SUMMARY OF THE INVENTION

The object of the invention is to avoid the drawback stated above. The invention is concerned with using a thin film of high permittivity dielectric material, denoted as "HK film" hereafter, covered on the top of the semiconductor surface. The thin film is capable of extracting some electric flux from one area of the device and to introduce it into the semiconductor surface at another area, or, contrary. The high permittivity material refers to its permittivity, $\epsilon_K(=K\epsilon_0)$, as being much larger than the permittivity of semiconductor $\epsilon_S(=S\epsilon_0)$, where $\epsilon_0$ is the permittivity of a vacuum and K and S are the relative permittivities of the high permittivity material and the semiconductor, respectively.

Actually, the optimum surface voltage-sustaining region occurs when the surface voltage-sustaining region has an electric flux density D required flowing to the substrate as shown in the solid curve of FIG. 1(b). Once this requirement is satisfied, then the semiconductor region under the surface voltage-sustaining region has the same boundary conditions under an applied voltage V. Therefore, the solutions of the electric field under the surface voltage-sustaining region are the same no matter how the electric flux is produced. The generation of the electric flux does not necessarily mean that the flux must be produced by ionized impurities of a semiconductor layer.

In accordance with the present invention, a method for fabricating a surface voltage-sustaining region for semiconductor devices is provided. Said semiconductor devices have a semiconductor substrate of a first-conductivity type and a largest potential region made by a metal or by a heavily doped semiconductor of a second-conductivity type and a smallest potential region made by a metal or by a heavily doped semiconductor region of a first-conductivity type, said largest potential region and said smallest potential region are contacted with the substrate, said surface voltage-sustaining region is located on the top of the substrate and from the largest potential region to the smallest potential region, wherein:

Said surface voltage-sustaining region has at least one section which has a thin film of high permittivity dielectric covered on the semiconductor surface.

Said thin film of high permittivity dielectric may have one or multiple section(s) where conductor is covered on its top, the conductor can be electrically floating or electrically connected to a voltage terminal outside of surface voltage-sustaining region.

Said surface voltage-sustaining region can also have one or multiple section(s) of second conductivity type and/or first conductivity type semiconductor layer with doping concentration(s) and/or conductivity type different from that of the substrate. Said surface voltage-sustaining region transmit a net average electric flux of first sign everywhere to the substrate when a reverse voltage close to the breakdown voltage is applied across the largest potential region and the smallest potential region-of the device, the effective average flux density starts from a value about $qN_B W_{pp}$ at the largest potential region and decreases its value gradually or stepwisely toward the smallest potential region, where q is the electron charge, $N_B$ is the impurity concentration of the substrate, $W_{pp}$ is the depletion width of a one-sided abrupt parallel-plane junction with the same substrate under its breakdown voltage, where the effective average flux density means an effective amount of flux in an area of a surface distance much smaller than $W_{pp}$ but much larger than the thickness of the surface voltage-sustaining region at that area divided by the area; where the thickness of the surface voltage-sustaining region means the thickness of the thin film of high permittivity dielectric plus the thickness of the semiconductor surface layer, which has different doping from that of the substrate.

Said electric flux of first sign means the flux has the same sign as the flux produced by the ionized impurity of the semiconductor of the second conductivity type;

Said net average electric flux of the first sign means the average electric flux of the first sign subtracting the average electric flux of the second sign, where second sign is opposite to the first sign.

Under the action of said net average flux of the first sign, the surface (lateral) field in said surface voltage-sustaining region has its minimum value close to zero from the position close to the region having the largest potential and increases its magnitude when the position is close to the region having the smallest potential.

Said electric flux density includes the flux density produced by the ionized impurities in the thin semiconductor layer of the surface voltage-sustaining region as well as the flux density introduced by the thin film of high permittivity dielectric at the surface.

Said flux density introduced by the thin film of high permittivity dielectric at the surface means the flux density introduced by a thin film of high permittivity dielectric with or without a conductor covered on its top.

The flux density introduced by the thin film of high permittivity dielectric without a conductor covered on its top means the quotient of the value of the flux flowing into a small section from the side near to the largest voltage region subtracted by the flux flowing out of the section from the side far to the largest voltage region divided by the distance of the small sections, where the flux flowing into the section and the flux flowing out of the section are the products of the lateral (surface) field and the sheet capacitance at the near side and at the far side to the largest voltage region respectively; where the sheet capacitance means the quotient of the amount of the component of the flux parallel to the surface divided by the component of the field in the same direction.

Wherein the flux density introduced by the thin film of high permittivity dielectric with a conductor covered on its top means the value of the electric potential at the top of the film subtracted by the electric potential at the bottom of the film and then multiplied by the specific capacitance of the thin film of high permittivity dielectric; where the specific capacitance means the value of the electric potential difference at the top of the film subtracted by the electric potential at the bottom of the film and then divided by the electric flux density induced by the electric potential difference.

Besides, this invention also proposes a thin voltage-sustaining region of semiconductor devices; said semiconductor devices have a smallest potential region made by a metal or by a heavily doped semiconductor region of a first-conductivity type and a largest potential region made by a metal or by a heavily doped semiconductor region of a second-conductivity type; said thin voltage-sustaining region of the semiconductor device is located between the largest potential region and the smallest potential region.

Said surface voltage-sustaining region has at least one section which has a thin film of high permittivity dielectric on its top.

Said thin film of high permittivity dielectric may have one or multiple section(s) where conductor is covered on its top, the conductor can be electrically floating or electrically connected to a voltage terminal outside of surface voltage-sustaining region.

Said thin surface voltage-sustaining region can also have one or multiple section(s) of semiconductor layer of first-conductivity type and/or semiconductor layer of second-conductivity type.

Said thin surface voltage-sustaining region transmits electric flux everywhere from the semiconductor to the thin film of high permittivity dielectric when a reverse voltage close to the breakdown voltage is applied across the largest potential region and the small potential region of the device, and the density of the flux equals to the net flux produced by the dose of the effective impurities of the semiconductor of said thin surface voltage-sustaining region.

Said electric flux transmitted by said thin semiconductor film of voltage-sustaining region is absorbed by the conductor covered on the top of the thin film of high permittivity dielectric and/or transmitted through the thin film of high permittivity dielectric, and eventually absorbed by the metal or by the heavily doped semiconductor region of the first-conductivity type of said smallest potential region and/or transmitted through the thin film of high permittivity dielectric and eventually absorbed by the metal or by the heavily doped semiconductor region of the second-conductivity type of said largest potential region.

Said thin voltage-sustaining region of semiconductor devices has almost a constant lateral field under a reverse biased voltage close to the breakdown voltage applied across the largest potential region and the smallest potential region when the electric fluxes are sent to the thin film of high permittivity dielectric.

The contents of this invention can be explained by following five examples.

The first example is a diode shown in FIG. 2. It consists of a $p^-$-type substrate 1, an $n^+$-type contact region 2, a $p^+$-type contact region 3 and a HK film 9. In the figure, A is the anode and K is the cathode. In the surface voltage-sustaining region (i.e., from x=0 to x=L) there are no ionized donor, the fluxes flowing into the substrate are completely due to that they are generated from the cathode K, transmitted through HK film 9 and gradually distribute to the semiconductor. The arrow-headed lines in the figure represent flux lines. At the places of HK film 9 having no electrode on its top, the thickness of the film decreases with the distance from K, ensuring the flux density flowing into the semiconductor decreased with the distance.

The second example is a diode shown in FIG. 4. It consists of a $p^-$-type substrate 1, an $n^+$-type contact region 2, a $p^+$-type contact region 3, an n-type drift region 4 and a HK film 9. In this example, there is already an n-type region 4 in the surface voltage-sustaining region, but the flux density produced by this region is larger than the maximum value of D shown in FIG. 1(b). The function of HK film 9 located from 0 to L is to take the fluxes of the n-region 4 in the place of x>0, these fluxes can be eventually terminated on the top of $p^+$-region 3, which is connected to the anode A. The thickness of the HK film 9 increases with the distance to x=0, allowing more and more flux to be taken in the film; so that the electric flux flowing from the surface voltage-sustaining region to the substrate can meet the requirement shown in FIG. 1(b).

The third example is a diode shown in FIG. 5. In this example, the n-type region 4 extends from x=0 to $x=d_0$ instead of from x=0 to x=L as it is in FIG. 4. The function of the section from x=0 to $x=d_0$ of the HK film 9 is to take some fluxes of the section from x=0 to $x=d_0$ of n-region 4, and release them gradually at the places of $x \geq d_0$ to the substrate. As a result, the flux density flowing from the surface voltage-sustaining region to the substrate can meet the requirement shown in FIG. 1(b).

The fourth example is a top-view of surface voltage-sustaining region shown in FIG. 13. The difference of this figure to the FIG. 1(e) is that there has a stripe of HK film 9 covered on an area containing points A and A'. The HK film 9 allows some fluxes produced by n-region 4 enter to the film and transmit them to p-region 8. Consequently, it looks like that, in the place under HK film 9, both the effective donor density of n-region 4 and the effective acceptor density of p-region 8 had been reduced. Therefore, the field component parallel to the semiconductor surface and perpendicular to the strip is much reduced at point A and A'.

The fifth example is shown in FIG. 17. This is an $n^+np^+$ diode consisting of an $n^+$-type contact region 2, a thin n-type region 4 and a $p^+$-type contact region 3. The surface voltage-sustaining region contains the n-type region 4 and HK-film 9 on its top. A conductor is place on the top of total HK film 9. When a voltage is applied across the cathode K and the anode A, the fluxes generated by the ionized donors of the n-type 4 are almost entirely transmitted through the HK film and terminated on the top-conductor, the lateral field in the n-type region 4 is almost a constant, similar to the field in the i-region of an $n^+$-i-$p^+$ diode. Thus, the n-type region is capable to sustain high voltage with a high dose of doping and with a very short lateral dimension.

BRIEF DESCRIPTIONS OF THE DRAWINGS

FIG. 1 shows the case of an optimum surface voltage-sustaining region based on a $p^-$-type semiconductor substrate:

FIG. 1(a) shows a schematic view of a cell of an interdigitated diode (the voltage-sustaining region is located from 0 to L of abscissa x, K is the cathode and A is the anode);

FIG. 1(b) shows a graph of the flux density D of surface donor versus the surface distance when the surface dimension of surface voltage-sustaining region is L (=$2W_{pp}$) and a breakdown voltage of 95% of $V_{Bpp}$ can be sustained across the cathode K and the anode A ($V_{Bpp}$, $W_{pp}$ and $D_0$ are the breakdown voltage, the depletion width and the electric flux density of the $n^+$-region of a one-sided abrupt parallel-plane junction with a substrate of the same doping concentration $N_B$, respectively, $D_0=qN_BW_{pp}$, $N_B$=concentration of the acceptors of the substrate);

FIG. 1(c) shows a graph of the surface lateral field $E_x$ versus distance under the condition of surface doping being as shown in FIG. 1(b), where $E_{crit}$ is the critical field for breakdown of a one-sided abrupt parallel-plane junction with the same substrate;

FIG. 1(d) shows a graph of the surface potential versus distance corresponding to a surface doping shown in FIG. 1(b), where $V_{Bpp}$ is the breakdown voltage of a one-sided abrupt parallel-plane junction with the same substrate doping concentration, $N_B$; and FIG. 1(e) shows a top view of the on-sided abrupt parallel-plane junction having a flux profile of three-section approximation shown in FIG. 1(b) by using the offset effect of oppositely doped regions with different locations.

FIG. 2 shows a cross-section of a diode having a surface flux density close to D as shown in FIG. 1(b) by forming a HK film on the top of surface voltage-sustaining region, where there is no surface doping region in the surface voltage-sustaining region and a part of the HK film is covered by a conductor connected to the cathode. (The arrow-headed curves represent the flux in the HK film).

Figure 3:
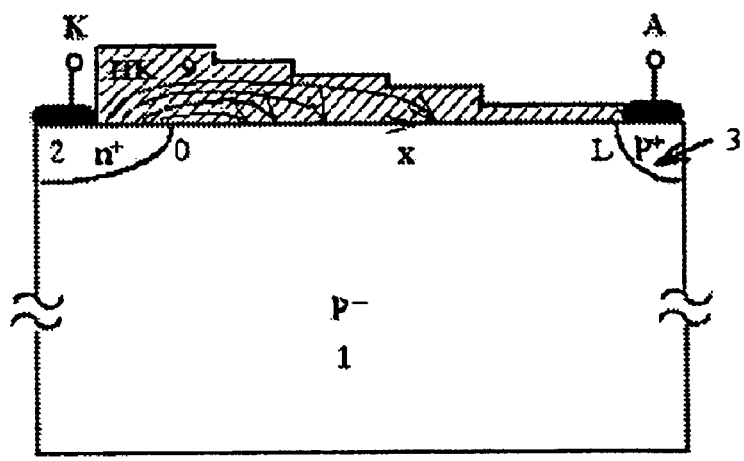

FIG. 3 shows a cross-sectional view of a diode having a surface flux density close to D as shown in FIG. 1(b) by covering a HK film on the top of surface voltage-sustaining region, where there is no surface doping region in the surface voltage-sustaining region and a part of the bottom of the HK film is directly contacted with $n^+$-region which is in turn connected with the cathode.

Figure 4:
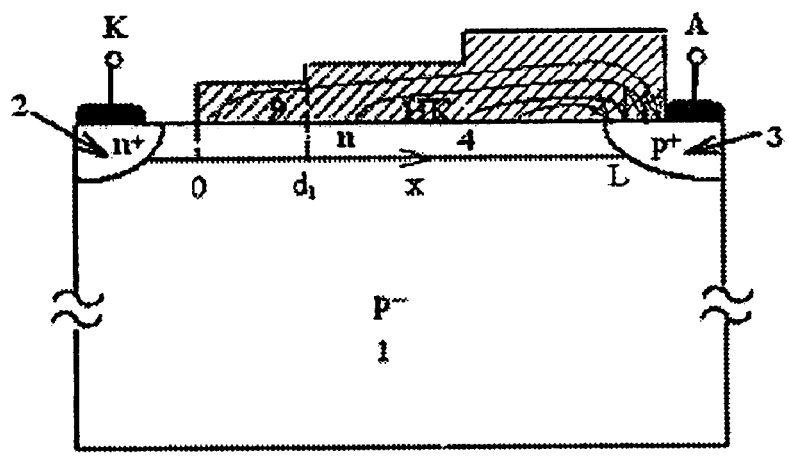

FIG. 4 shows a cross-sectional view of a diode having method for realizing a surface flux density close to D shown in FIG. 1(b) by covering a HK film on the top of surface voltage-sustaining region, where there is an n-region 4 having doping density larger than the maximum value required. (The HK film can make the substrate have an incident flux density decreasing with increasing of x.)

Figure 5:
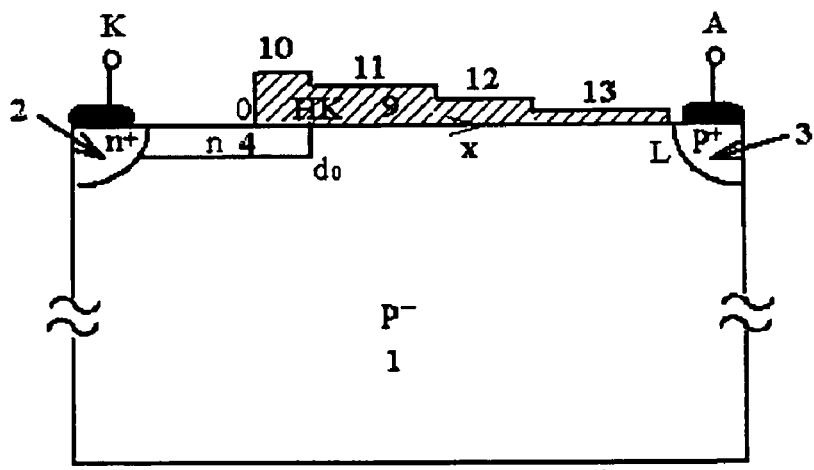

FIG. 5 shows a cross-sectional view of a diode that uses the HK film to meet the required optimum flux density for the substrate by a surface voltage-sustaining region and has a section of donor density that is larger than the required value.

Figure 6:
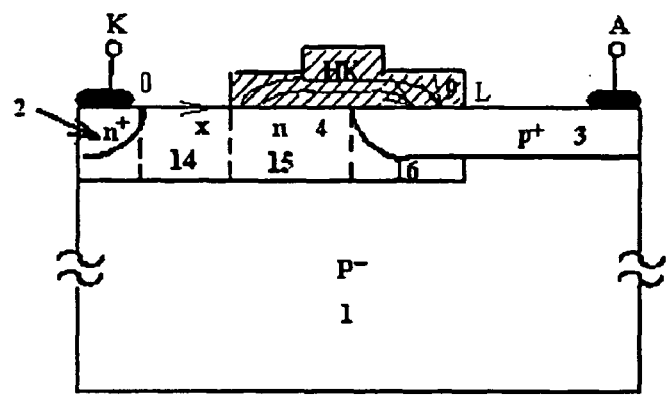

FIG. 6 shows a cross-sectional view of a diode that has an HK film, where the flux density of the ionized donors of the surface n-region equals to the maximum value as shown in FIG. 1(b) and where a part of the n-region is covered with p-region which generates a flux density with opposite sign of the n-region and with a magnitude exceeding the maximum value as shown in FIG. 1(b).

Figure 7:
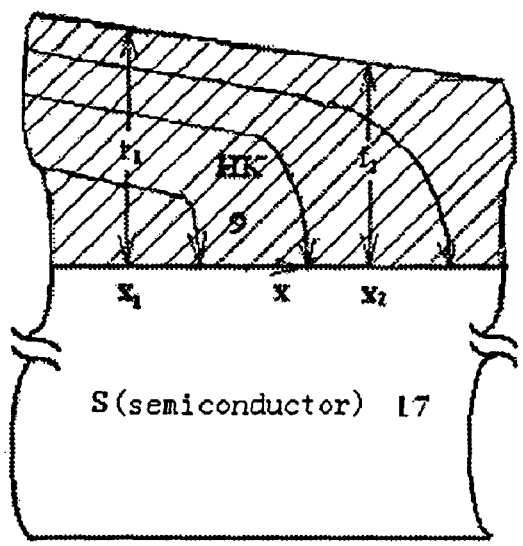

FIG. 7 shows a cross-sectional view of a semiconductor structure where the amount of flux flowing from $x_1$ to $x_2$ into the semiconductor equals to the amount of flux flowing laterally into the HK film at $x_1$ subtracted by the amount of flux flowing laterally out of the HK film at $x_2$.

Figure 8:
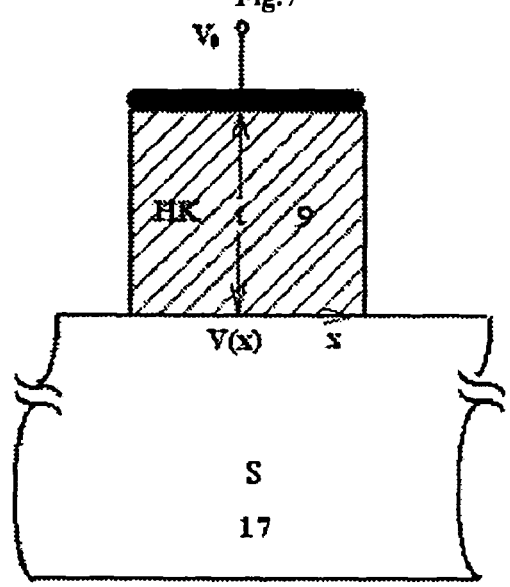

FIG. 8 shows a cross-sectional view of a semiconductor structure where the top of a section of semiconductor is contacted with a conductor connected with a certain electric potential $V_0$.

Figure 9:
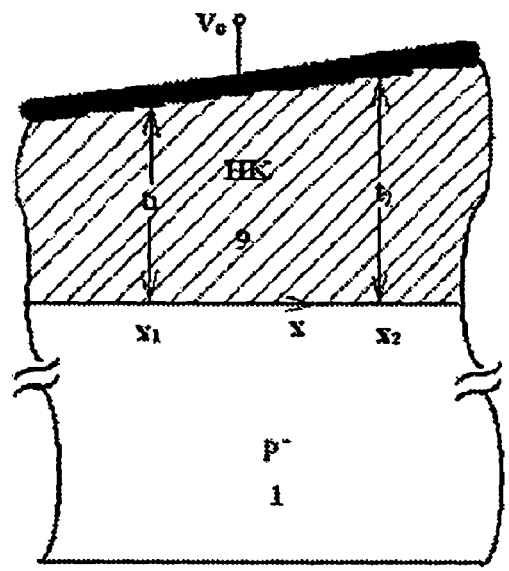

FIG. 9 shows a cross-sectional view of a semiconductor structure where the thickness of the HK film is not a constant and the top of the HK film is contacted with a conductor connected with a certain electric potential $V_0$.

Figure 10:
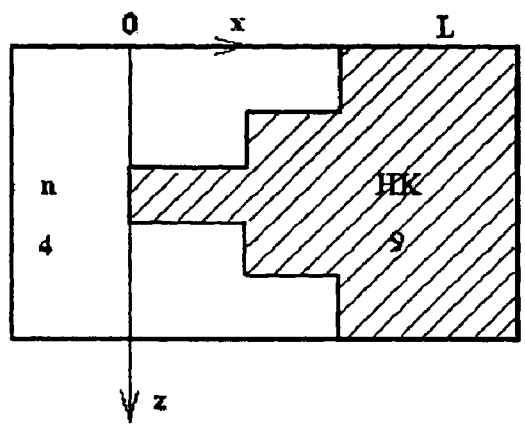

FIG. 10 shows a top view of the semiconductor structure showing the variation of the rate of covering of HK film for substituting the variation of the thickness of the HK film.

Figure 11:
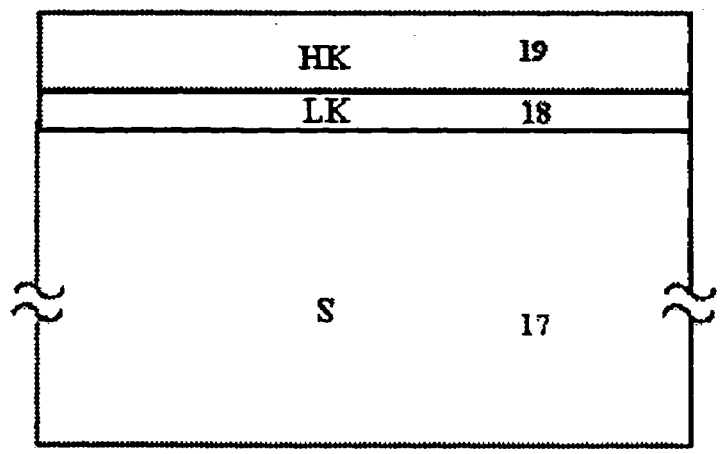

FIG. 11 shows a cross-sectional view of a semiconductor structure having an HK film formed on a low permittivity (LK) film, which is formed on a semiconductor substrate.

Figure 12:
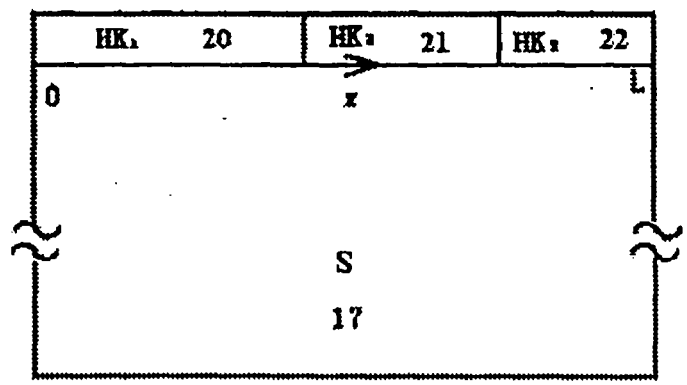

FIG. 12 shows a cross-sectional view of a semiconductor structure having an HK film that consists of three sections, each with different value of permittivity $HK_1$, $HK_2$, $HK_3$. The permittivity increases in that order.

Figure 13:
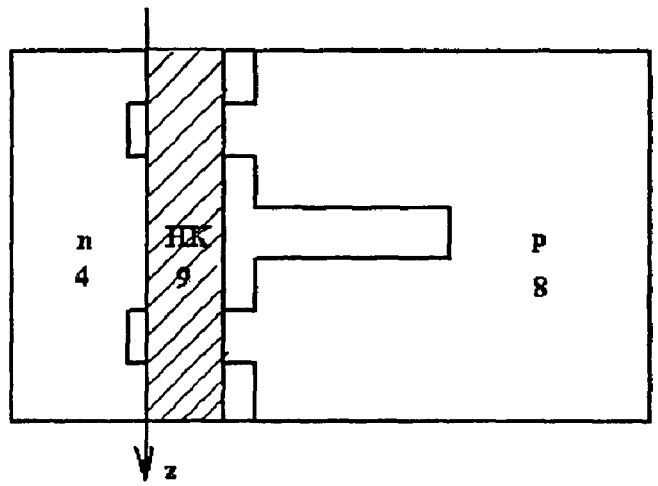

FIG. 13 shows a strip of HK film is placed on a region containing points A and A' of FIG. 1(e) to reduce the field parallel to the semiconductor surface and perpendicular to the p-stripe.

Figure 14:
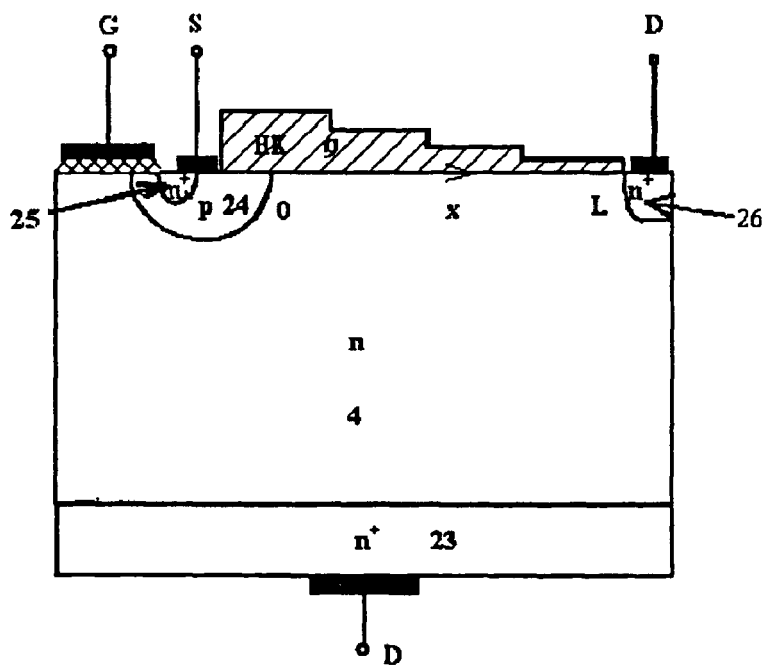

FIG. 14 shows a cross-sectional view of an n-VDMOST using the variation lateral flux of HK film as its edge termination technique.

Figure 15:
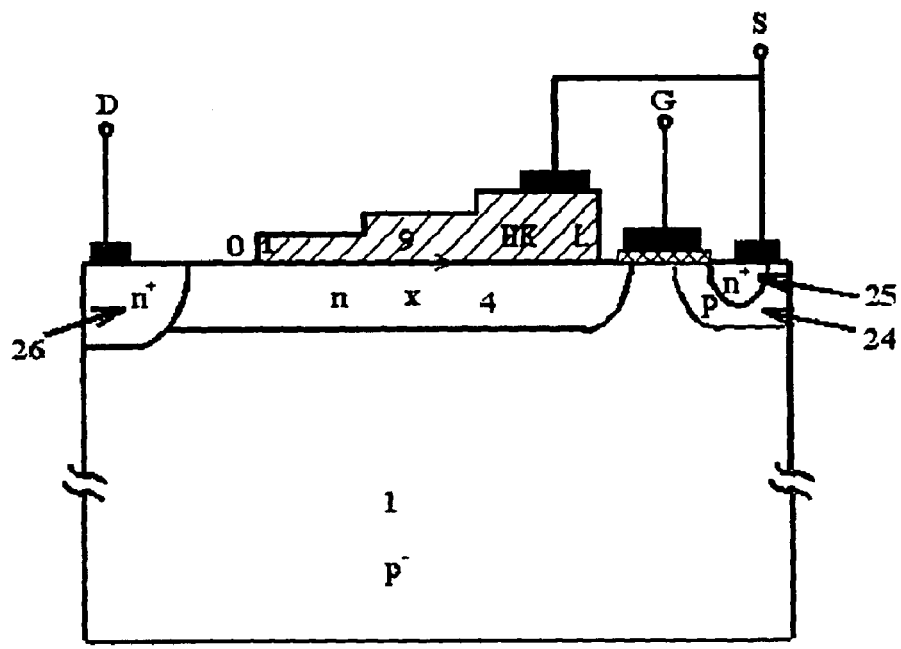

FIG. 15 shows a cross-sectional view of a lateral n-MOST having the surface voltage-sustaining region of FIG. 4.

Figure 16:
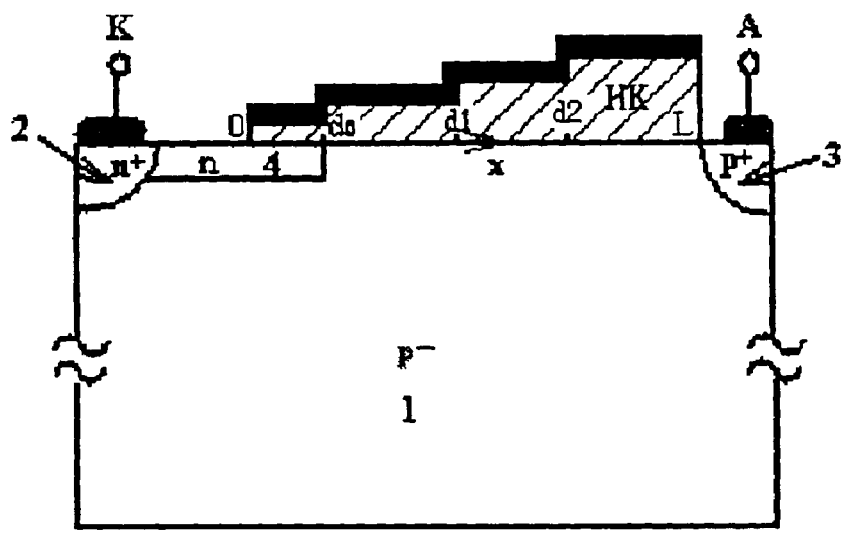

FIG. 16 shows a cross-sectional view of a diode, wherein a HK film and a floating electrode on the top of HK film realize the variation lateral flux.

Figure 17:
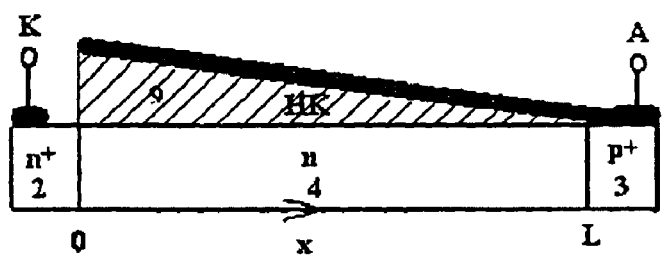

FIG. 17 shows a cross-sectional view of a diode with a thin n-type voltage-sustaining region and without a p⁻-substrate where a HK film has covered on its top and the HK film in turn has covered with a conductor that is connected to the anode A.

Figure 18A:
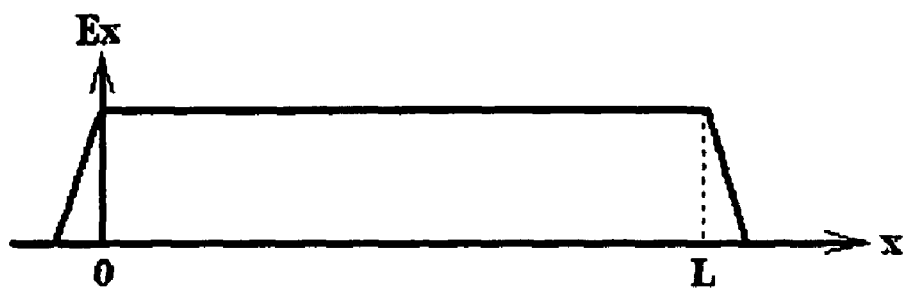

FIG. 18(a) shows a graph of the lateral field, $E_x$, versus distance, x, for the device shown in FIG. 17 when there is a voltage $V_K$ applied across the cathode K and the anode A.

Figure 18B:
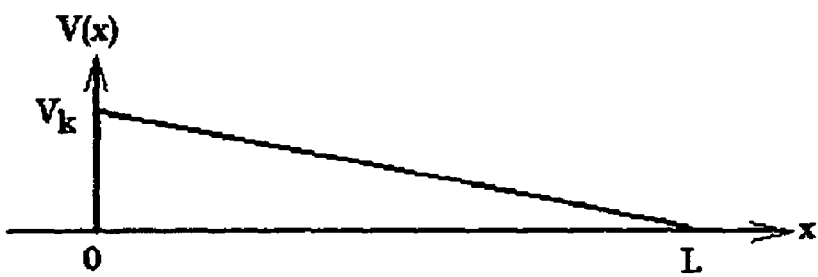

FIG. 18(b) shows a graph of the surface potential, V(x), versus distance, x, for the device shown in FIG. 17 when there is a voltage $V_K$ applied across the cathode K and the anode A.

Figure 19:
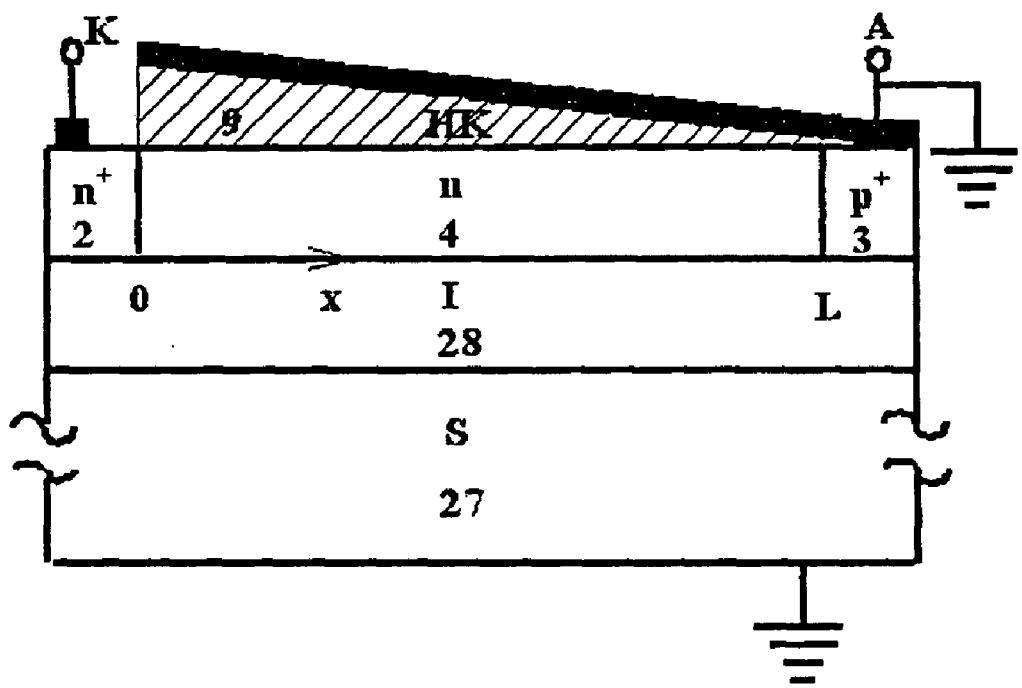

FIG. 19 shows a cross-sectional view of a diode made on a SIS, where the n-region has covered with a HK film and the HK film is covered with a conductor that connected to the anode.

Figure 20:
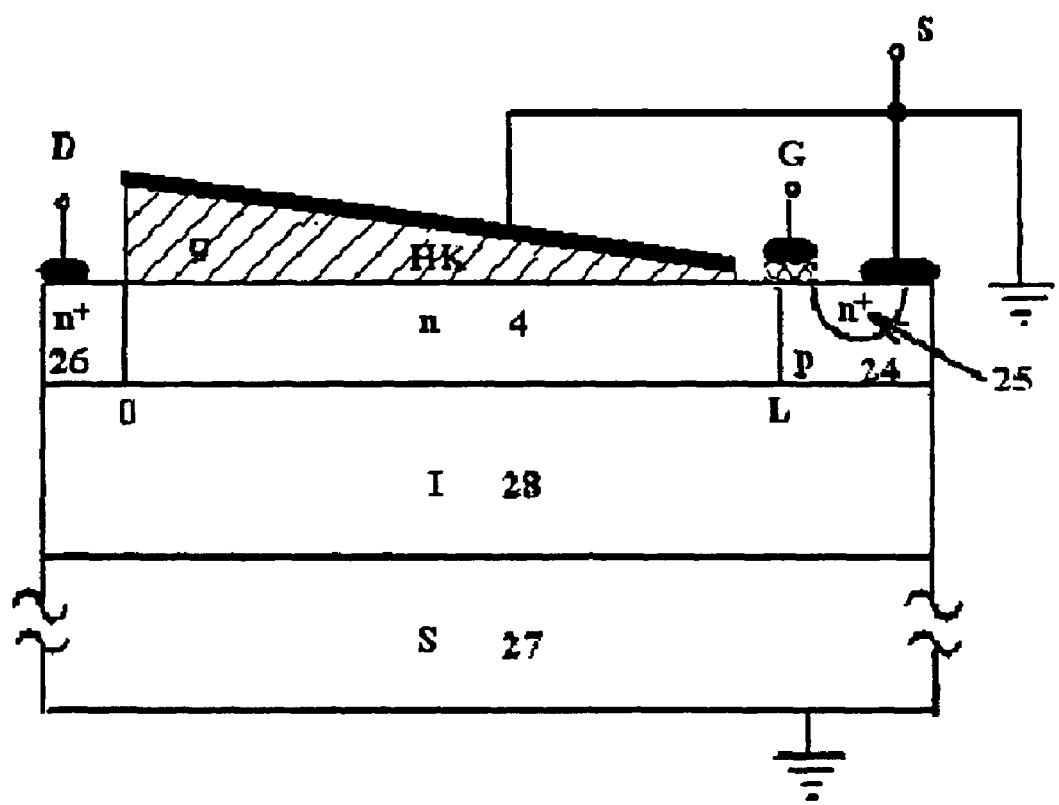

FIG. 20 shows a cross-sectional view of a lateral MOST using the surface voltage-sustaining region shown in FIG. 19.

Figure 21:
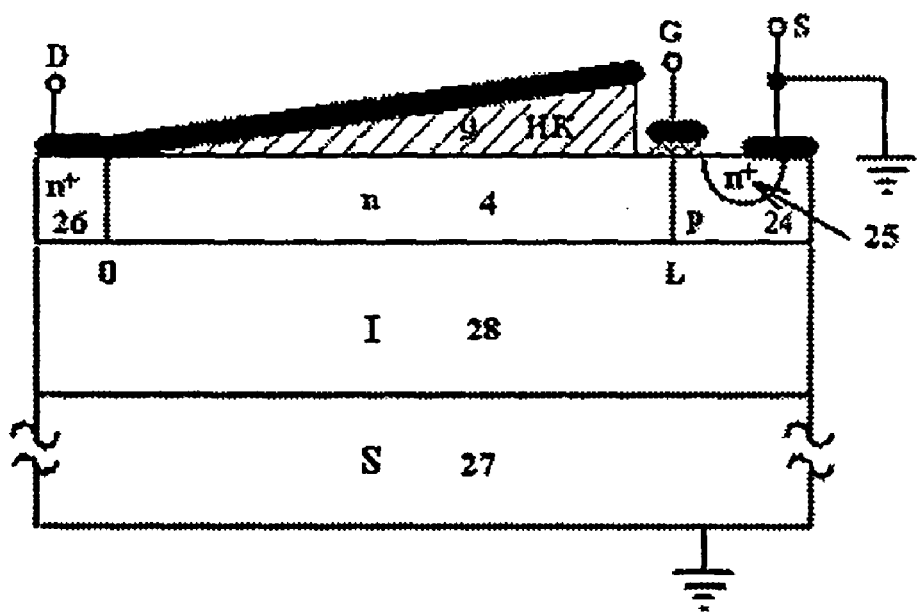

FIG. 21 shows a cross-sectional view of a lateral MOST made on a SIS, where the n-region has covered with a HK film and the HK film is covered with a conductor that is connected to the drain electrode.

DESCRIPTION OF THE PREFERRED EMBODIMENTS

The function of a surface voltage-sustaining region is to transmit an electric flux density which varies with the distance to the largest potential region, or to say, a variation lateral flux (VLF). A surface voltage-sustaining region using optimum variation lateral doping (VLD) is only one of the methods to realize optimum VLF. This invention provides another method to implement an optimum VLF flowing into the substrate.

FIG. 2 shows a cross-sectional view of a high voltage diode having an optimum VLF in accordance with the present invention. The method is to cover the semiconductor surface with a HK film 9, which has a thickness varying with distance. There is no surface n-type region 4 from the cathode K, which contacts n⁺-type region 2 to the anode A, which contacts p⁺-type region 3 as shown in FIG. 1. The broad dark lines represent the contact of the electrode, and the shaded area represents the HK film 9. The HK film 9 has a permittivity $\epsilon_K$ substantially larger than the permittivity of the semiconductor, $\epsilon_S$. The thickness of HK film 9 increases gradually starting from x=0, the edge of the cathode, to x=$d_1$. When $0 \leq x \leq d_0$, and $d_0 \leq d_1$, the HK film has a conductor on the top, and this conductor is connected with the cathode K. The arrow-headed curves schematically show the flux lines in the HK film 9. When $d_0 \geq x \geq 0$, a large amount of flux flows to the semiconductor. Beyond this area, the flux density flowing from HK film 9 to the semiconductor becomes less and less due to that the traveling distance is larger and larger as well as the thickness of the HK film 9 is smaller and smaller.

An appropriate design of the thickness of the HK film versus distance can make the flux density D(x) meets the requirement as the curve shown in FIG. 1(b).

FIG. 3 shows another embodiment of a high-voltage diode that uses the approaches of the present invention to make the HK film that satisfies the requirements of the curve shown in FIG. 1(b). Here, the HK film is very thick on the n⁺-region 2, which is connected to the cathode K. The flux generated from the n⁺-region 2 enters into the HK film and then diverts gradually, flowing into the semiconductor. Thus, the HK film 9 can perform the same action as the HK film 9 in FIG. 2.

The above two examples are for the case where there is no n-type voltage sustaining region 4 on the substrate 1. The flux entering to the substrate is provided by HK film. Actually, negative flux, i.e., the flux flowing out from the surface of the semiconductor, if necessary, can also be provided by the dielectric film. FIG. 4 shows such an example. FIG. 4 shows a cross-section of a high-voltage diode having a surface n-type voltage sustaining region. Here, a thin surface n-type region 4 is located from the cathode K, which is connected n⁺-region 2, down to the p⁺-region 3 which is connected to the anode A. The dose of impurities of the region 4 is larger than the maximum value required from FIG. 1(b). In order to make the flux flowing from the n-region 4 to the substrate have a density decreasing with the distance as shown by the curve in FIG. 1(b), a HK film 9 with a thickness ever increasing with the distance is covered on the surface starting from x=0. Some fluxes flow out of the semiconductor in the place of $d_1 \geq x \geq 0$ to the HK film 9. At $x=d_1$, more flux flows out of the semiconductor because the HK film is thicker, and the same thing occurs for other places. The outgoing flux of the semiconductor acts as a surface p-type region shown in FIG. 1(e), resulting a flux density flowing from n-type region 4 into the p$^-$-type substrate 1 decreases as the distance increases. All of the flux going into the HK film from x=0 to x=L are terminated eventually by the p$^+$-region 3.

In the above-mentioned examples, the HK film has a terminal connected with an electrode or a heavily doped region which is connected with an electrode. It should be noted that a HK film can perform either absorption of flux from the semiconductor or emission of the flux to the semiconductor. FIG. 5 shows another cross-section of a high-voltage diode having the HK film. In this example, the n-type region 4 has a uniform dose, which generates a flux density much larger than the maximum value of D shown in FIG. 1(b). However, n-type region 4 extends only up to $x=d_0$, the remaining part of surface voltage-sustaining region (i.e., from $x=d_0$ to x=L) cannot provide any flux to the substrate. The required optimum VLF is produced in this way. In the first section 10 of the HK film 9, an amount of positive flux flows to the HK film 9, so that the net flux flowing to the substrate beneath the n-region 4 can meet the requirement of line 5 as shown in FIG. 1(b). The amount of flux flowing into the HK film goes inside the film along the direction of the abscissa, and some of them divert into substrate through semiconductor surface in the section marked 11. Accordingly, certain amounts of fluxes can flow into substrate in the sections marked with 12 and 13. By using the physical parameters and the geometrical parameters in accordance with the present invention, an optimum VLF can be met.

FIG. 6 shows another cross-section of a high-voltage diode having a HK film. In this figure, the first section of n-type region 14 has a donor density equal to that required by line 5 of FIG. 1(b). The second section of n-type region 15 has a donor density higher than that required by line 6 of FIG. 1(b). In the third section 16, the net donor density, i.e., the donor density subtracted by the acceptor density of p$^+$-region 3, is lower than that required by line 7 of FIG. 1(b). A HK film is deposited on sections 15 and 16, where it can absorb some flux of the second section 15 and transmit them at third section 16 into the semiconductor, thereby producing a resultant effective flux to the p$^-$-substrate 1 and satisfying the stepwise variation of flux density shown in FIG. 1(b).

The HK film may be modeled using conventional using numerical analysis and device simulation software packages, such as TMA/MEDICI, TMA/DAVINCI, etc. Some analytic calculation methods for approximation are presented hereinbelow. The results of such calculation can at least be a first approximation for starting a more precise numerical simulation.

The formulas given in the following are based upon two fundamental theorems:
1) the conservation of total fluxes, that is: in an area without space charge, div D=0, where D is the flux density vector. Thus, the amount of fluxes entering in a section of HK film equals to the amount of fluxes leaving from this section; and
2) the potential difference between two points is independent of the path taken, that is, curl E=0, where E is the field strength vector. Thus, at both sides of an interface between a HK film and semiconductor, the components of the electric field parallel to the interface are equal.

In FIG. 7, the thickness of the HK film changes from a value of $t_1$ at point $x=x_1$ to a value of $t_2$ at point $x=x_2$ and the value of $(x_2-x_1)$ is much smaller than $W_{pp} \cdot \epsilon_K/\epsilon_S$, where $W_{pp}$ is the depletion width of a one-sided abrupt parallel-plane junction with the same substrate under its breakdown voltage. In a unit length perpendicular to the paper, the amounts of flux entering into and leaving out of the HK film 9 from the left side and the right side are $t_1 D_x(t_1)$, $(=t_1 \epsilon_K E_x(x_1))$ and $t_2 D_x(t_2)$ $(=t_2 \epsilon_K E_x(x_2))$, respectively, where $D_x$ and $E_x$ represent the x-components of D and E. The difference of these two amounts is the total flux emitted into semiconductor 17, which is written as $D_y(x_1-x_2)$ Thus, $$D_y(x_1-x_2) = \epsilon_k(t_1 E_x(x_1) - t_2 E_x(x_2))$$

From the above equation, the thickness of HK film for the position from $x_1$ to $x_2$ may be determined by providing the values of $E_x(x)$ and $D_y$, which may be determined by using, e.g., FIG. 1(c).

The lateral component of the amount of electric flux in a dielectric film divided by the lateral component of the electric field is called sheet capacitance and denoted by $C_\square$. For the example taken above, it should be noted that $C_\square = \epsilon_k t$. Note also that when $x_1 \to x_2$, the flux density $D_y$ transmitted to the semiconductor can be expressed as $$D_y = -d(C_\square E_x)/dx \quad (1)$$

For the range from $x=d_0$ to x=L in FIG. 2 and the range from x=0 to x=L in FIG. 5, the value of $D_y$ and $E_x$ can be determined by using FIG. 1(b) and FIG. 1(c), so, the variation of $C_\square$ with respect to distance x can be determined. It is evident then that $C_\square$ must decrease rapidly with increasing x, to ensure that a substantial flux density $D_y$ is generated.

For the range from x=0 to x=L in FIG. 4 and the range from x=0 to $x=d_0$ of FIG. 5, the $D_y$ required by the HK film 9 is negative, due to that the flux density $D_n$ produced by surface n-type region 4 is already larger than the maximum value shown in FIG. 1(b), which is about 1.1 $D_0$. A proper increasing of $C_\square$ versus distance can result a required negative value of $D_y$.

The examples discussed above do not have a conductor placed on the top of the HK film. Examples where a conductor is placed on the top of HK film are discussed below.

As shown in FIG. 8, the ideal potential of semiconductor surface is assumed to be V(x), which, e.g., can be determined from FIG. 1(d), where the required flux density entering the surface is assumed to be $D_y(x)$. Then, $\epsilon_k(V_0-V(x))/t=D_y(x)$, or $t=\epsilon_k(V_0-V(x))/D_y(x)$, where t is the thickness of the HK film at x, $V_0$ is the potential of the conductor on the top of the dielectric film, and the conductor has a certain voltage.

Note that the flux density transmitted into a semiconductor surface divided by the potential difference between the top electrode of the HK film and the semiconductor beneath the HK film is called the specific capacitance and denoted by $C_V$. For the example shown in FIG. 8, it is evident that $C_V = \epsilon_k/t$, where t is the thickness of the HK film. By substituting the definition of $C_V$ into the equation $t=\epsilon_k(V_0-V(x))/D_y(x)$, one gets $$D_y(x) = C_V(V_0 - V(x)) \quad (2)$$

In FIG. 9, a conductor is formed on the HK film 9 and connected to a certain electric potential $V_0$. As shown, the thickness of the HK film 9 is non-uniform. The design of such a film is complicated. A rough estimation of the thickness $t_1$ at $x_1$ and the thickness $t_2$ at $x_2$ is as follows.

The flux transmitted into the semiconductor in the section from $x_1$ to $x_2$ has two sources. One is the flux generated from the electrode at the top of the HK film, another is from the difference of the flux entering into the film at the left edge, $x_1$, and the flux leaving out of the film at the right edge, $x_2$. The first source can be determined by the vertical field on the surface. This vertical field $E'_y$ has the values of $E'_y(x_1)=(V_0-V(x_1))/t_1$ and $E'_y(x_2)=(V_0-V(x_2))/t_2$ and thereupon the flux densities are $\epsilon_k E'_y(x_1)$ and $\epsilon_k E'_y(x_2)$ at $x_1$ and $x_2$, respectively. Thus, an average flux density from the top of HK film 9 to the semiconductor in the section starting from $x_1$ and ending at $x_2$ can be approximated by $[\epsilon_k E'_y(x_1)+\epsilon_k E'_y(x_2)]/2$.

Actually, the field perpendicular to the semiconductor surface—$E'_y$—stated above is a component of the field at the top of the HK film, the latter itself is perpendicular to the conductor at the top of HK films 9. There is angle $\theta_0$ between the top and the bottom of the HK film. This angle can be determined by the relation: $\tan\theta_0=(t_2-t_1)/(x_2-x_1)$. If the field on the top is E', then the field at the bottom is $E'_y=E'\cos\theta_0$. There is another component of field at the top, which is in x-direction and equal to $E'_x=E'\sin\theta_0$. From above it can be concluded that $E'_x=E'y\tan\theta_0$.

The field component $E_x$ parallel to the semiconductor surface can be determined by FIG. 1(c). Therefore, the field component parallel to the semiconductor surface changes from $E_x$ at the bottom of the HK film to $E'_x$ at the top of the HK film. The average of the lateral field is $(E_x+E'_x)/2$, and has different value at $x_1$ and $X_2$. The amount of flux entering into HK film 9 from the left edge at $x_1$ is $\epsilon_k t_1[E_x(x_1)+E'_x(x_1)]/2$, and leaving out of HK film on the right edge is $\epsilon_k t_2[E_x(x_2)+E'_x(x_2)]/2$. The difference of the two amounts, which is the second source of flux transmitted into the semiconductor, divided by $(x_2-x_1)$ is the flux density produced by the lateral field (the field parallel to the semiconductor surface).

In the above-mentioned examples, a variation of the thickness of the HK film is used to achieve the required flux density entering the semiconductor. As discussed in commonly assigned U.S. Pat. Nos. 5,726,469 and 6,310,365 B1, the required flux density is an average value taken in an area having a dimension much smaller than the depletion width $W_{pp}$ of a one-sided abrupt parallel-plane junction with the same substrate under its breakdown voltage. It should also be noted that the HK film may be formed on a certain part of surface voltage-sustaining region instead of the whole area. FIG. 10 shows an illustrative method to substitute the structure of HK film of FIG. 4. This figure is a top view of the HK film, which is shown as shaded area. Assume the thickness of the HK film is t, then the rightmost part is equivalent to a dielectric layer with uniform thickness of t, the middle part is equivalent to a dielectric layer with thickness smaller than t, the left part is equivalent to a dielectric layer with even smaller thickness. The equivalent dielectric layer can be considered as having equivalent thicknesses equaling the rate of occupied area in the z-direction multiplied by t, where the rate of occupied area is the ratio of the width of the dielectric to a unit width.

The last paragraph can also be illustrated in terms of sheet capacitance. In fact, the sheet capacitance $C_\square$ of the HK film 9 in FIG. 4 increases as the value of x increased. Whereas in FIG. 10, the area of the HK film increases with x reveals that the equivalent (or the average) sheet capacitance increases with x. Thus, both HK films in FIG. 4 and FIG. 10 perform the same function to the electric flux.

For the case of a conductor placed on the top of HK film and having a certain potential, the calculation of the equivalent thickness is quite different from that stated in the last paragraph. A small rate of occupied area means a small average flux density, and it is equivalent to a larger thickness of the HK film. From the viewpoint of specific capacitance, a small rate of occupied area means that the number of parallel-connected specific capacitances is small and thus a small average specific capacitance, corresponding to an increase of the thickness of a fully covered HK film.

In summary, the flux density entering the semiconductor can be changed by a variation of the pattern of the dielectric layer.

Note that a HK film is does not have to be composed of only one kind of dielectric material. The HK film can be composed by several kinds of materials. Moreover, the semiconductor can be firstly covered by a thin layer of low permittivity (denoted hereafter by LK) material (e.g., a $SiO_2$ layer on Si), and then covered by one or multiple layer(s) of HK material. The LK film is not able to substantially obstruct the flux flowing from the HK film to the semiconductor or vice versa provided that the thickness of the LK film is much smaller than that of HK film. FIG. 11 shows an example, where a thin LK film 18 is formed directly to the semiconductor surface 17, and the HK film 19 is formed on the top of the LK film 18.

The expression of effective sheet capacitance for a multiple dielectric layer can be written as $$C_\square = \sum_{i=1}^{n} C_{\square i}$$

where $$C_{\square i}=\epsilon_{Ki} t_i$$

where the thickness and permittivity of each layer are denoted by $t_i$ and $\epsilon_{Ki}$, respectively, and the number of layers is n.

If a conductor is placed on the multiple layer, then the effective specific capacitance $C_V$ can be expressed as $$\frac{1}{C_V} = \sum \frac{1}{C_{Vi}}$$

where $$C_{Vi}=\epsilon_{Ki}/t_i$$

The HK film 9 can consist of different materials. FIG. 12 shows a substitution of the HK film of FIG. 4. Here, three HK films 20, 21, and 22 are used, where $K_3>K_2>K_1$. The advantage of such a method is that each film can have the same thickness provided that the values of $K_1,K_2$ and $K_3$ are chosen appropriately.

Another use of HK film is to eliminate or to relieve the peak of field. FIG. 13 shows a method to reduce the field components parallel to the semiconductor surface and perpendicular to the p-type strip 5 at points A and A' of FIG. 1(e). A strip of HK film 9 in z-direction, the shaded area in the figure, is placed at the top of semiconductor surface. The HK film 9 allows some fluxes produced by n-region 4 to enter the film and transmit them to p-region 8. Consequently, it looks like that, in the place under HK film 9, both the effective donor density of n-region 4 and the effective acceptor density of p-region 8 had been decreased. Therefore, the field component parallel to the semiconductor surface and perpendicular to the strip is much reduced at point A and A'.

In the foregoing specification, the examples given heretofore have been described as having a p-substrate.

However, one of ordinary skill in the art appreciates that this technique may be readily used with an n-substrate.

The method to implement optimum variation lateral flux of this invention can also be used for different lateral devices. Besides, it can also be used as edge termination technique for the area beyond the active region of vertical devices. FIG. 14 shows a cross-section of a vertical n-VDMOST having the HK film for edge termination. The vertical n-VDMOST has an n$^+$-drain region 23, an n-region 4, a p-type source-substrate region 24, an n$^+$-type source contact region 25, an n$^+$-type drain contact region 26 and a variation thickness HK film 9, where G is the gate electrode, D is the drain electrode and S is the source electrode. The surface voltage-sustaining region uses a similar method as shown in FIG. 3, where the only difference is that all p-regions and n-regions have been exchanged.

For lateral (surface) devices, the examples given heretofore are only diodes. FIG. 15 shows an example of lateral n-MOST using the surface voltage-sustaining region of FIG. 4. This n-MOST has a p$^-$-type substrate 1, an n-type region 4, a p-type source-substrate 24, an n$^+$-type source region 25, an n$^+$-type drain contact region 26 and a HK film with varying thickness, where G is the gate electrode, D is the drain electrode and S is the source electrode. The crossed shaded area is the gate insulation. The surface voltage-sustaining region starts from x=0 to x=L. The last portion of HK film 9 is capped with a conductor connected to the source, which in turn is connected to the substrate.

FIG. 16 shows an example to use a floating electrode on the top of HK film for realizing VLF. The semiconductor under the HK film is the same as FIG. 5. In the portion of x=0 to x=d$_0$, the fluxes generated by the semiconductor flow through HK film and are terminated by the top electrode, whereas in the portion of x≧d$_0$, the fluxes generated by the top electrode go through the HK film and enter into the semiconductor. An approximate method for calculating the physical and the geometrical parameters of the HK film is as follows. Assume the average potential of the semiconductor surface in the portion of x=0 to x=d$_0$ is V$_0$, in the portion of x=d$_0$ to x=d$_1$ is V$_1$, in the portion of x=d$_1$ to x=d$_2$ is V$_2$, in the portion of x=d$_2$ to x=d$_3$ (=L) is V$_3$, and the specific capacitances of HK film of these portions are C$_{V0}$, C$_{V1}$, C$_{V2}$, and C$_{V3}$, respectively. Also, assume that the demanding average flux densities entering the semiconductor are D$_0$, D$_1$, D$_2$ and D$_3$, respectively. Then, the relationship of these parameters is:

$$(V_{fi} - V_i)C_{Vi} = D_i, \ i=0,1,2,3 \quad (3)$$

where Vn is the potential of the floating electrode. On the other hand, the total amount of flux generated by the floating electrode should be zero, that is $$\sum_{i=0}^{3} D_i(d_i - d_{i-1}) = 0, \quad \text{Where } d_{-1} = o \quad (4)$$

Actually, from the demanding values of D$_i$ and V$_i$ and given values of d$_i$, one can find the values of V$_{fi}$ and C$_{Vi}$, using equations (3) and (4). In the example of FIG. 16, the value of D$_0$ is negative.

The optimum surface flux density presented heretofore is for a surface voltage-sustaining region appearing as a source of flux density to the substrate, and the density meets the requirement of FIG. 1(b). Actually, the principle of this invention can also be applied to other cases. FIG. 17 shows an example of n$^+$np$^+$ diode, which has no substrate below it. A thin n-type layer 4 is located between an n$^+$-region 2, which is connected to a cathode K, and a p$^+$-type region 3, which is connected to an anode A. If one not only desires that the dose of n-type layer 4 be not very light but also the breakdown voltage to be high, then it is desirable to have all of the flux generated by the donors of region 4 be absorbed by the HK film 9 formed on it. In that case, the electric field component along the x direction under a voltage V$_k$ applied across the cathode K and the anode A is a constant, and it becomes similar to the case of an n$^+$-i-p$^+$ diode. The potential distribution in n-region is like that shown in FIG. 18(a), and the field profile is like that shown in FIG. 18(b).

If the flux density produced by the ionized donor of the thin n-type layer 4 is D$_n$ and all of them should be absorbed by the conductor formed on the top of the film and the conductor is connected electrically to the electrode K, then, at any abscissa of x:

$$D_n = \epsilon_k V_x/t_x$$

where V$_x$ is the potential at point x in the n-region, and t$_x$ and $\epsilon_x$ are the thickness and the permittivity of the HK film at x, respectively.

Since the demanding V$_x$ can be expressed as V$_k$(1−x/L), where L is the length of n-region 4, it is evident from the above equation that, t$_x$=t$_M$(1−x/L) is required, where t$_M$ stands for the maximum thickness of the HK film.

In the above derivation, the flux generated from the bottom of n-region 4 is assumed to be absorbed equally as that from the top. Actually, for the flux from the bottom of n-region 4 to the electrode, it can be considered that there are two capacitances in series connection: one is $\epsilon_k/t_x$ and another is $\epsilon_S/d$, where d is the thickness of n-region. As far as $\epsilon_S/d >> \epsilon_k/t_x$, the above derivation is acceptable. Otherwise, one needs to revise the calculation of t$_x$.

FIG. 17 shows an n$^+$np$^+$ diode where no electric flux is transmitted from the bottom of the n-region 4. A practical case is the SIS structure, where a thin semiconductor layer (S) is formed on a layer of insulator (I) and the insulator layer (I) is in turn formed on a semiconductor (S). FIG. 19 shows such a case, where semiconductor layer (S) 27, is a semiconductor, and insulator layer (I) 28, is a not very thin layer of SiO$_2$. Because the permittivity of SiO$_2$ (layer 28), is one third that of Si, the flux generated by the donor in the n-region has only a little part transmitting to the substrate. Thus, the derivation given above can be used as a first approximation.

FIG. 20 shows an example of using the surface voltage-sustaining region of FIG. 19 to make a lateral MOST, which consists of a S-layer 27, an I-layer 28, an n-region 4, an n$^+$-source region 25, a p-type substrate 24, an n$^+$-drain region 26 and a HK film 9 with varying thickness, where G is the gate electrode and the shaded area beneath it is an insulator layer. The difference between this device and a normal lateral MOST based on SIS is that a HK film is capped on the n-drift region 4 and the top conductor is connected electrically to the source electrode.

It should be noted that the above principle can also be applied to the case where the top conductor on the HK film being connected to K in FIG. 17 or to D in FIG. 20. Then, the thickness of the HK film should be increased as the distance from K or D increases. FIG. 21 shows a lateral MOST using such a connection. This MOST consists of a S-layer 27, I-layer 28, an n-type region 4, an n$^+$-type source region 25, a p-type source-substrate region 24, an n$^+$-drain region 26 and a HK film with varying thickness, where G is the gate electrode, S is the source electrode and D is the drain electrode.

By making use of the structure shown in FIG. 20 or FIG. 21, a lateral MOST can have a short drift region with a heavy dose and a high breakdown voltage. The specific on-resistance can be very small.

The example shown in FIG. 17 is for a semiconductor device whose voltage-sustaining layer has a HK film on one side only. Naturally, a HK film can also placed on the other side. If the HK film on the latter side has covered a conductor that is connected to n$^+$-region 2, then the specific capacitance resulted by it should be decrease as the distance from the n$^+$-region 2 increases. If the conductor is connected to p$^+$-region 3, then the specific capacitance resulted by it should be increase as the distance from the n$^+$-region 2 increase.

In current sub-micron integrated circuit technology, a Si MOST needs a HK material to replace the conventional SiO$_2$. Also, capacitances with smaller area need a HK film to implement. There are already some materials for HK film available.

Although two types of devices and one edge termination technique have been illustrated for the description of the embodiments of this invention. A person skilled in the art can extend the usage of this invention to other devices.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements includes not only those elements but may also include other elements not expressly listed or inherent to such process, method, article, or apparatus.

What is claimed is:

1. A surface voltage-sustaining region for semiconductor devices, said semiconductor devices have a semiconductor substrate of a first-conductivity type and a largest potential region made by a metal or by a heavily doped semiconductor of a second-conductivity type and a smallest potential made by a metal or by a heavily doped semiconductor region of a first-conductivity type, said largest potential region and said smallest potential region are contacted with the substrate, said surface voltage-sustaining region is located on the top of the substrate and from the largest potential region to the smallest potential region, wherein:

said surface voltage-sustaining region has at least one section which has a thin film of high permittivity dielectric covered on the semiconductor surface;

said thin film of high permittivity dielectric may have one or multiple section(s) where conductor is covered on its top, the conductor can be electrically floating or electrically connected to a voltage terminal outside of surface voltage-sustaining region;

said surface voltage-sustaining region can also have one or multiple section(s) of second conductivity type and/or first conductivity type semiconductor layer with doping concentration(s) and/or conductivity type different from that of the substrate;

said surface voltage-sustaining region transmit a net average electric flux of first sign everywhere to the substrate when a reverse voltage close to the breakdown voltage is applied across the largest potential region and the smallest potential region, the effective average flux density starts from a value about $qN_B/W_{pp}$ at the largest potential region and decreases its value gradually or stepwisely toward the smallest potential region, where q is the electron charge, $N_B$ is the impurity concentration of the substrate, $W_{pp}$ is the depletion width of a one-sided abrupt parallel-plane junction with the same substrate under its breakdown voltage, where the effective average flux density means an effective amount of flux in an area of a surface distance much smaller than $W_{pp}$ but much larger than the thickness of the surface voltage-sustaining region at that area divided by the area; where the thickness of the surface voltage-sustaining region means the thickness of the thin film of high permittivity dielectric plus the thickness of the semiconductor surface layer, which has different doping from that of the substrate;

said electric flux of first sign means the flux has the same sign of the flux produced by the ionized impurity of the semiconductor of the second conductivity type;

said net average electric flux of the first sign means the average electric flux of the first sign subtracting the average electric flux of the second sign, where second sign is opposite to the first sign;

under the action of said net average flux of the first symbol, the surface (lateral) field in said surface voltage-sustaining region has its minimum value close to zero from the position close to the region having the largest potential and increases its magnitude when the position is close to the region having the smallest potential;

said electric flux density includes the flux density produced by the ionized impurities in the thin semiconductor layer of the surface voltage-sustaining region as well as the flux density introduced by the thin film of high permittivity dielectric at the surface;

said flux density introduced by the thin film of high permittivity dielectric at the surface means the flux density introduced by a thin film of high permittivity dielectric with or without a conductor covered on its top, wherein:

the flux density introduced by the thin film of high permittivity dielectric without a conductor covered on its top means the quotient of the amount of the flux flowing into a small section from the side near to the largest voltage region subtracted by the flux flowing out of the section from the side far to the largest voltage region divided by the distance of the small sections, where the flux flowing into the section and the flux flowing out of the section are the products of the lateral (surface) field and the sheet capacitance at the near side and at the far side to the largest voltage region respectively; where the sheet capacitance means the quotient of the amount of the component of the flux parallel to the surface divided by the component of the field in the same direction;

wherein the flux density introduced by the thin film of high permittivity dielectric with a conductor covered on its top means a value of the electric potential at the top of the film subtracted by the electric potential at the bottom of the film and then multiplied by the specific capacitance of the thin film of high permittivity dielectric, where the specific capacitance means a value of the electric potential at the top of the film subtracted by the electric potential at the bottom of the film and then divided by the electric flux density induced by the electric potential difference.

2. The surface voltage-sustaining region for semiconductor devices of claim 1, wherein the semiconductor substrate of a first conductivity is a p-type semiconductor, the semiconductor of a second conductivity type is an n-type semiconductor, said electric flux of the first sign has a sign coinciding with the sign of the flux generated by a positive charge, said largest potential is the highest potential, said smallest potential is the lowest potential, said voltage-sustaining region transmits everywhere positive flux to said substrate.

3. The surface voltage-sustaining region for semiconductor devices of claim 1, wherein the semiconductor substrate of a first conductivity is an n-type semiconductor, the semiconductor of a second conductivity type is a p-type semiconductor, said electric flux of the first sign has a sign coinciding with the sign of the flux generated by a negative charge, said largest potential is the lowest potential, said smallest potential is the highest potential, said voltage-sustaining region transmits everywhere negative flux to said substrate, in other words, absorb everywhere positive flux from said substrate.

4. The surface voltage-sustaining region for semiconductor devices of claim 1, wherein the surface voltage-sustaining region contains only a thin film of high permittivity dielectric, said thin film of high permittivity dielectric has not been covered by conductor on its top, said sheet capacitance of said thin film of high permittivity dielectric decreases gradually or stepwisely along a surface distance to said largest potential region.

5. The surface voltage-sustaining region for semiconductor devices of claim 1, wherein the surface voltage-sustaining region contains a section of a doped semiconductor region of the second conductivity type located by said largest potential region and having an amount of impurities of the second conductivity type in a unit area exceeding $N_B W_{pp}$, said thin film of high permittivity dielectric has no conductor on its top and has a sheet capacitance decreasing gradually or stepwisely according to the surface distance to the largest potential region.

6. The surface voltage-sustaining region for semiconductor devices of claim 1,,wherein the surface voltage-sustaining region has a doped semiconductor region of the second conductivity type located from said largest potential region up to said smallest potential region and having an amount of impurities of the second conductivity type in a unit area exceeding $N_B W_{pp}$, said thin film of high permittivity dielectric has no conductor on its top and has a sheet capacitance decrease gradually or stepwisely according to the surface distance to the largest potential region, said thin film of high permittivity dielectric covers also a region which is connected electrically to the smallest potential region.

7. The surface voltage-sustaining region for semiconductor devices of claim 1, wherein the surface voltage-sustaining region contains a section of a doped region of the second conductivity type located by said largest potential region and having a net amount of impurities of the second conductivity type in a unit area exceeding $N_B W_{pp}$ and a section of a doped region of the first conductivity type located close to said smallest potential region, said sheet capacitance of said thin film of high permittivity dielectric increases gradually or stepwisely along the surface distance to said largest potential region in the portion near the largest potential region and decreases gradually or stepwisely along the surface distance to said smallest potential region in the portion near the smallest potential region.

8. The surface voltage-sustaining region for semiconductor device of claim 1, wherein said surface voltage-sustaining region has only a thin film of high permittivity dielectric, said thin film of high permittivity dielectric is covered by a conductor located by the largest potential region where the top conductor is connected electrically to the largest potential, said specific capacitance of the conductor covered region decreases gradually or stepwisely along a surface distance to said largest potential region, said sheet capacitance of no conductor covered region decreases gradually or stepwisely towards said smallest potential region.

9. The surface voltage-sustaining region for semiconductor devices of claim 1., wherein a doped region of the second conductivity type extends from said largest potential region to said smallest potential region and has a net amount of impurities of the second conductivity type in a unit area exceeding $N_B W_{pp}$; said thin film of high permittivity dielectric is covered on its top by a conductor on its top in a section located by the smallest potential region where the top conductor is connected electrically to the smallest potential, said sheet capacitance of no conductor covered region increases gradually or stepwisely along a surface distance to said largest potential region, said specific capacitance of conductor covered region increases gradually or stepwisely towards said smallest potential region.

10. The surface voltage-sustaining region for semiconductor devices of claim 1, wherein the thickness of said thin film high permittivity dielectric varies gradually or stepwisely along a surface distance to said largest potential region.

11. The surface voltage-sustaining region for semiconductor devices of claim 1, wherein the rate of covering of said thin film of high permittivity dielectric varies gradually or stepwisely along a surface distance to said largest potential region.

12. The surface voltage-sustaining region for semiconductor device of claim 1, wherein said thin film of high permittivity dielectric has at least one section consisting of a multiple kinds of dielectric material conjuncted together.

13. The surface voltage-sustaining region for semiconductor devices of claim 1, wherein said surface voltage-sustaining region has one or multiple section(s) of second conductivity type and/or first conductivity type semiconductor layer and one or multiple section(s) of thin film of high permittivity dielectric covered on the semiconductor surface.

14. The semiconductor device contains one or multiple surface voltage-sustaining region(s) of claim 1.

15. The semiconductor device contains one or multiple surface voltage-sustaining region(s) of claim 1 located beyond the active region, said surface voltage-sustaining region(s) serve as edge termination.

16. A thin voltage-sustaining region for semiconductor devices has a smallest potential region made by a metal or by a heavily doped semiconductor region of a first-conductivity type and a largest potential region made by a metal or by a heavily doped semiconductor region of a second-conductivity type; said thin voltage-sustaining region of the semiconductor device is located between the largest potential region and the smallest potential region, wherein:

said surface voltage-sustaining region has at least one section which has a thin film of high permittivity dielectric on its top;

said thin film of high permittivity dielectric may have one or multiple section(s) where conductor is covered on its top, the conductor can be electrically floating or electrically connected to a voltage terminal outside of surface voltage-sustaining region;

said thin surface voltage-sustaining region can also have one or multiple section(s) of semiconductor layer of first-conductivity type and/or semiconductor layer of second-conductivity type;

said thin surface voltage-sustaining region transmits electric flux everywhere from semiconductor to the thin film of high permittivity dielectric when a reverse voltage close to the breakdown voltage is applied across the largest potential region and the small potential region of the device, and the density of the flux equals to the net flux produced by the dose of the effective impurities of the semiconductor of said thin surface voltage-sustaining region;

said electric flux transmitted by said thin semiconductor film of voltage-sustaining region is absorbed by the conductor covered on the top of the thin film of high permittivity dielectric and/or transmitted through the thin film of high permittivity dielectric and eventually absorbed by the metal or by the heavily doped semiconductor region of the first-conductivity type of said smallest potential region, and/or transmitted through the thin film of high permittivity dielectric and eventually absorbed by the metal or by the heavily doped semiconductor region of the second-conductivity type of said largest potential region;

said thin voltage-sustaining region of semiconductor devices has almost a constant lateral field under a reverse biased voltage close to the breakdown voltage applied across the largest potential region and the smallest potential region.

17. The semiconductor device contains one or multiple voltage-sustaining region(s) of claim 16.

18. The semiconductor device contains one or multiple voltage sustaining region(s) of claim 16, wherein said thin voltage-sustaining region is placed on a dielectric layer of low permittivity, the latter is in turn placed on a semi-insulator or insulator.

19. The semiconductor devices according to claim 16, wherein both sides of thin voltage sustaining region of semiconductor are covered by thin film of high permittivity dielectric, the bottom side is like the top side when the view of the devices is upside-down.

20. The semiconductor devices according to claim 16, wherein the thin semiconductor voltage-sustaining region is a p-type semiconductor and the sign of flux generated by a negative charge is taken as positive.

* * * * *